United States Patent
Moon et al.

(10) Patent No.: US 8,537,469 B2
(45) Date of Patent: Sep. 17, 2013

(54) METHODS FOR PRODUCING LENS ARRAYS

(75) Inventors: Jonathan A. Moon, Freemans Bay (NZ); David E. Roberts, Hillsboro, WI (US)

(73) Assignee: Securency International Pty Ltd, Craigieburn, Victoria (AU)

( * ) Notice: Subject to any disclaimer, the term of this patent is extended or adjusted under 35 U.S.C. 154(b) by 0 days.

(21) Appl. No.: 13/203,070

(22) PCT Filed: Mar. 3, 2010

(86) PCT No.: PCT/AU2010/000243
§ 371 (c)(1), (2), (4) Date: Oct. 26, 2011

(87) PCT Pub. No.: WO2010/099571
PCT Pub. Date: Sep. 10, 2010

(65) Prior Publication Data
US 2012/0033305 A1     Feb. 9, 2012

Related U.S. Application Data

(60) Provisional application No. 61/157,309, filed on Mar. 4, 2009.

(51) Int. Cl.
*G02B 27/10* (2006.01)
*G03B 21/60* (2006.01)

(52) U.S. Cl.
USPC .......................................... 359/619; 359/443

(58) Field of Classification Search
USPC ............... 359/618–621, 626, 443, 454–455; 457/162, 164, 165, 226, 227, 553, 554, 555; 264/1.1, 1.32, 2.7
See application file for complete search history.

(56) References Cited

U.S. PATENT DOCUMENTS

| | | | |
|---|---|---|---|
| 6,084,713 A | 7/2000 | Rosenthal | |
| 6,833,960 B1 | 12/2004 | Scarbrough et al. | |
| 6,989,931 B2 | 1/2006 | Rosenthal | |
| 8,248,702 B2 * | 8/2012 | Hoffman et al. | 359/621 |
| 2002/0027300 A1 * | 3/2002 | Hartmann et al. | 264/1.1 |
| 2007/0058260 A1 * | 3/2007 | Steenblik et al. | 359/626 |
| 2008/0100918 A1 | 5/2008 | Saville, Jr. | |
| 2009/0008923 A1 * | 1/2009 | Kaule et al. | 283/67 |

FOREIGN PATENT DOCUMENTS

WO    2006/125224    11/2006

OTHER PUBLICATIONS

Search Report for International Patent Application No. PCT/AU2010/000243; Apr. 28, 2010.

* cited by examiner

*Primary Examiner* — Dawayne A Pinkney
(74) *Attorney, Agent, or Firm* — Barnes & Thornburg LLP

(57) ABSTRACT

A lens array for imaging image elements in an object plane, and a method of making a lens array. The lens array includes lenslets formed in or on one side of a transparent or translucent material with the image elements disposed on the opposite side, and has a gauge thickness corresponding to the distance from the apex of each lenslet to the object plane. Each lenslet has a set of lens parameters. The gauge thickness and/or at least one lens parameter is or are optimised such that each lenslet has a focal point size in the object plane which is either substantially equal to the size of the image elements in the object plane, or varies from the size of the image elements by a predetermined amount.

20 Claims, 14 Drawing Sheets

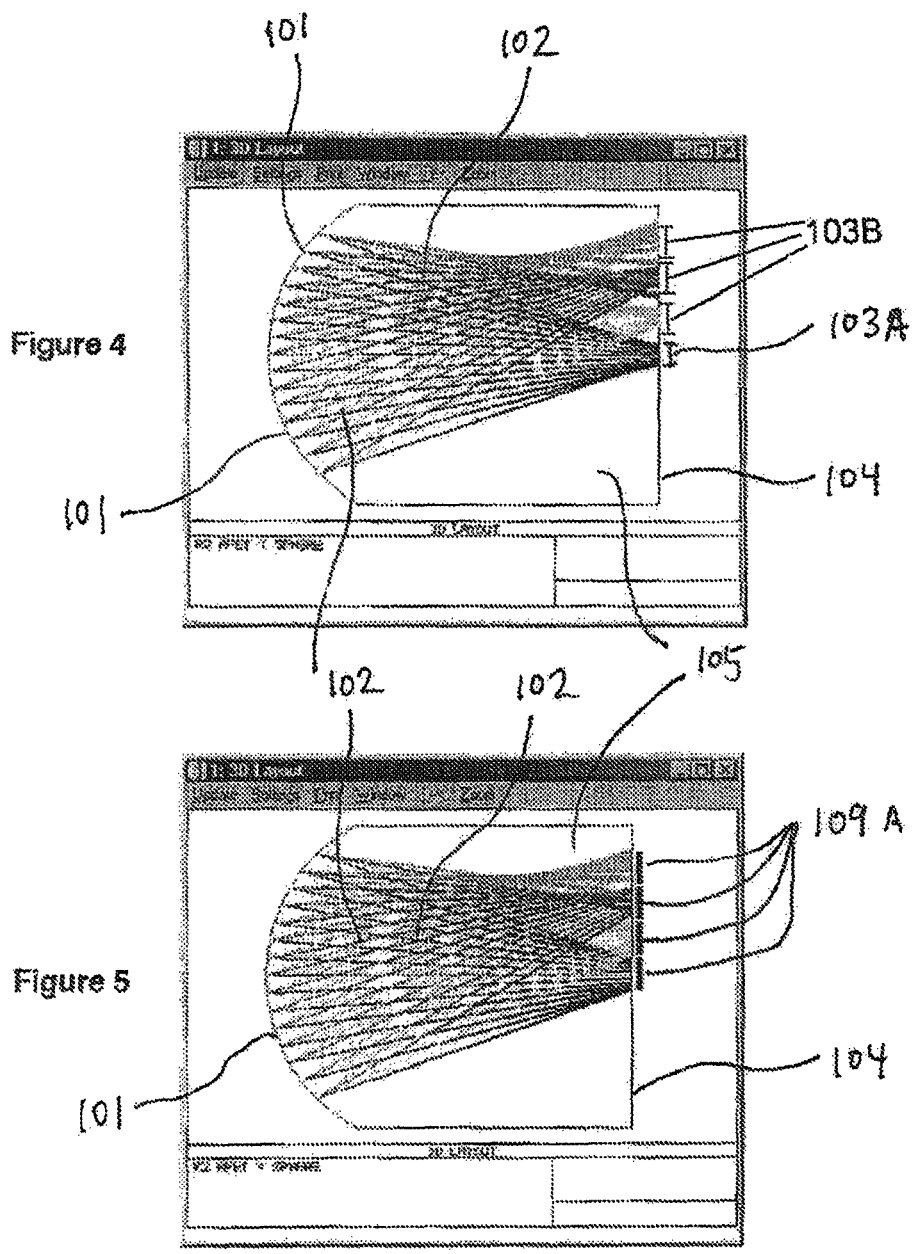

METHODS FOR PRODUCING LENS ARRAYS

PRIORITY CLAIM

This patent application is a U.S. National Phase of International Patent Application No. PCT/AU2010/000243, filed 3 Mar. 2010, which claims priority to U.S. Provisional Patent Application No. 61/157,309, filed 4 Mar. 2009, the disclosures of which are incorporated herein by reference in their entirety.

FIELD

The disclosed embodiments relate to methods for designing and manufacturing lens arrays, and to lens arrays produced thereby.

BACKGROUND

Lens arrays allow the generation of a number of different types of optical effect. For example, an array of lenses focussed on underlying image elements at the focal plane of the array can generate integral images which appear to be three dimensional, which move, change magnification or morph as the viewing angle changes, or which have apparent depth outside the plane of the lens array. A further effect can be achieved by interleaving two or more images underneath the lenses, for example in strips underneath a plurality of cylindrical lenses, so that the viewer sees different images as the viewing angle changes. Such visual effects are useful in a number of applications including displays, promotional materials, collectable articles and as optically variable devices in security documents.

Lens arrays are generally manufactured from transparent polymeric materials to produce a sheet of material, referred to herein as a lenticular sheet. The pattern of the lenslets forming the array is embossed or otherwise formed on one side of the sheet, and the opposing side of the sheet is formed into a flat, generally gloss-type surface. The image elements are applied to or placed at the flat surface and may be formed, for example, by printing or by a laser marking process. The sheet material is commonly manufactured as a monolayer, but multilayer methods are also used.

The image elements may comprise printed dots. In one process, prior to printing, a continuous image representing the desired final print on the flat surface is converted to a halftone image. After printing, the halftone image will appear as a plurality of printed dots on the flat surface.

The thickness (usually termed the gauge thickness) of the lenticular sheet has traditionally been determined by the focal length of the lenslets, such that incoming light rays substantially focus at the flat surface of the sheet. This design is chosen to take advantage of the so-called sampling effect. The sampling effect ensures that a dot printed at the focal length of the lens will appear to an observer at a particular viewing angle as a line across a cylindrical lens, and will appear to fill the entire lens area for a non-cylindrical lens. Therefore, an observer cannot distinguish two adjacent dots inside a single lens at a particular viewing angle.

In some cases, the material thickness and lens frequency (or pitch) of the lenslets may be pre-selected according to the needs of the end product, as well as the gauge limitations of the sheet material manufacturing process. The lens radius of curvature is then determined based on additional parameters such as the refractive index and Abbe number of the polymeric material used, so as to focus incoming light rays substantially at the flat side of the sheet.

The recent trend in the art has been to produce thinner lenticular sheets so as to reduce manufacturing costs, while at the same time broadening the potential applications of optical effect articles. However, a thinner lenticular sheet generally requires a higher lens frequency in order to produce a focussed image. For example, a material produced with a gauge thickness of 85 microns in polyester would require a lens frequency of approximately 224 lenslets per centimeter. Printing optical effect imagery on these high frequency microlens arrays is particularly challenging, and severely limits the type of effect that can be achieved and the type of press and prepress methods than can be used. Furthermore, a high rate of waste material often results as very high line screens must be utilised and very accurate colour-to-colour registration becomes critical. These problems have meant that use of very high frequency lenticular sheet material has heretofore been limited.

One attempt to overcome the above problems is described in U.S. Pat. No. 6,833,960. Lenses are formed as hemispheres on a substrate using curable resins in a printing press. In this method, it is not possible to form the lenses on the substrate at their focal point. The lenses are thus substantially off-focus and this nullifies the sampling effect. The imagery produced by the method is thus substantially blurred.

Another method is described in U.S. Pat. No. 6,989,931 and includes a composite image comprised of printed stripes viewable through a lenticular screen from a first angle, with an object or image placed a distance behind the lenticular screen viewable through transparent stripes at a second angle. In one embodiment, a lenticular material thinner than its focal length can be used since the stripes printed on the flat side of the lenticular material do not contain multiplexed optical effect imagery. The lenslets need not possess the resolving power required for traditional optical effect imagery, but instead view only one half of the area behind each lenslet. However, use of this method for multiplexed lenticular imagery or intricate moiré effects can produce severe blurring.

Accordingly, there is a need for a method of reducing the gauge thickness of a lens array without introducing substantial blurring or other objectionable image artifacts.

In some circumstances it may be desirable to manufacture a lenticular sheet at a particular gauge thickness. If this is the case, it may then be desirable to reduce the lens frequency, i.e. to increase the width of each lenslet, in order to maintain image quality in view of the constraints of the printing process (or other process for forming the image elements) to be used. It is therefore desirable to provide a lens array and a method which allows a lower lens frequency to be used without introducing substantial blurring or other objectionable image artifacts.

Any discussion of documents, acts, materials, devices, articles or the like which has been included in the present specification is solely for providing a context for the disclosed embodiments. It is not to be taken as an admission that any or all of these matters form part of the prior art base or were common general knowledge in the field relevant to the disclosed embodiments as they existed in Australia before the priority date of each claim in this application.

SUMMARY

One disclosed embodiment provides a lens array for imaging a plurality of image elements in an object plane, the lens array including a plurality of lenslets formed in or on one side of a transparent or translucent material with the image elements disposed on the opposite side, the lens array having a gauge thickness corresponding to the distance from the apex of each lenslet to the object plane, wherein each lenslet has a set of lens parameters, with the gauge thickness and/or at least one lens parameter optimised such that each lenslet has a focal point size in the object plane which is substantially equal to the size of the image elements in the object plane, or which varies from the size of the image elements by predetermined amount.

Another embodiment provides a method of manufacturing a lens array for imaging a plurality of image elements in an object plane, the lens array including a plurality of lenslets, the lens array having a gauge thickness corresponding to the distance from the apex of each lenslet to the object plane, the method including the steps of:

determining a scale parameter which is representative of the size of the image elements in at least part of the object plane, using the scale parameter to optimize the gauge thickness and/or at least one parameter of a set of lens parameters for each lenslet, and forming the lens array with the gauge thickness and the lens parameters in or on one side of a transparent or translucent material with the image elements being disposed on the opposite side of the transparent or translucent material, whereby, the lenslets have a focal point size in the object plane which is substantially equal to the size of the image elements, or which varies from the size of the image elements by a predetermined amount.

The set of lens parameters may include lens width, refractive index, sag height, radius of curvature, conic parameter and Abbe number. Some or all of these may be varied in order to obtain a focal point size with the desired characteristics in the object plane.

Optionally, each lenslet has a cross-section which is a conic section. The lenslets may be cylindrical or have a part-spherical or aspherical cross-section. Each lenslet may be rotationally symmetric in the plane of the lens array. In one embodiment, each lenslet may be an elongate lenticule having substantially uniform cross section along its length.

DEFINITIONS

Focal Point Size H

As used herein, the term focal point size refers to the dimensions, usually an effective diameter or width, of the geometrical distribution of points at which rays refracted through a lens intersect with an object plane at a particular viewing angle. The focal point size may be inferred from theoretical calculations, ray tracing simulations, or from actual measurements. The present inventors have found that ray tracing simulations using software such as ZEMAX closely match direct measurements of lenses designed according to the methods described herein. The ray tracing simulation can be adjusted to account for the fact that incoming rays are not exactly parallel in reality.

Focal Length f

In the present specification, focal length, when used in reference to a microlens in a lens array, means the distance from the vertex of the microlens to the position of the focus given by locating the maximum of the power density distribution when collimated radiation is incident from the lens side of the array (see T. Miyashita, "Standardization for microlenses and microlens arrays" (2007) Japanese *Journal of Applied Physics* 46, p 5391).

Gauge Thickness t

The gauge thickness is the distance from the apex of a lenslet on one side of the transparent or translucent material to the surface on the opposite side of the translucent material on which the image elements are provided which substantially coincides with the object plane.

Lens Frequency and Pitch

The lens frequency of a lens array is the number of lenslets in a given distance across the surface of the lens array. The pitch is the distance from the apex of one lenslet to the apex of the adjacent lenslet. In a uniform lens array, the pitch has an inverse relationship to the lens frequency.

Lens Width W

The width of a lenslet in a microlens array is the distance from one edge of the lenslet to the opposite edge of the lenslet. In a lens array with hemispherical or semi-cylindrical lenslets, the width will be equal to the diameter of the lenslets.

Radius of Curvature R

The radius of curvature of a lenslet is the distance from a point on the surface of the lens to a point at which the normal to the lens surface intersects a line extending perpendicularly through the apex of the lenslet (the lens axis).

Sag Height s

The sag height or surface sag s of a lenslet is the distance from the apex to a point on the axis intersected by the shortest line from the edge of a lenslet extending perpendicularly through the axis.

Refractive Index n

The refractive index of a medium n is the ratio of the speed of light in vacuo to the speed of light in the medium. The refractive index n of a lens determines the amount by which light rays reaching the lens surface will be refracted, according to Snell's law:

$$n_1 * \mathrm{Sin}(\alpha) = n * \mathrm{Sin}(\theta),$$

where $\alpha$ is the angle between an incident ray and the normal at the point of incidence, at the lens surface $\alpha$ is the angle between the refracted ray and the normal at the point of incidence, and $n_1$ is the refractive index of air (as an approximation $n_1$ may be taken to be 1).

Conic Constant P

The conic constant P is a quantity describing conic sections, and is used in geometric optics to specify spherical (P=1), elliptical (0<P<1, or P>1), parabolic (P=0), and hyperbolic (P<0) lens. Some references use the letter K to represent the conic constant. K is related to P via K=P−1.

Lobe Angle

The lobe angle of a lens is the entire viewing angle formed by the lens.

Abbe Number

The Abbe number of a transparent or translucent material is a measure of the dispersion (variation of refractive index with wavelength) of the material. An appropriate choice of Abbe number for a lens can help to minimize chromatic aberration.

Security Document

As used herein, the term security document includes all types of documents and tokens of value and identification documents including, but not limited to the following: items of currency such as banknotes and coins, credit cards, cheques, passports, identity cards, securities and share certificates, driver's licenses, deeds of title, travel documents such as airline and train tickets, entrance cards and tickets, birth, death and marriage certificates, and academic transcripts.

Transparent Windows and Half Windows

As used herein the term window refers to a transparent or translucent area in the security document compared to the substantially opaque region to which printing is applied. The window may be fully transparent so that it allows the transmission of light substantially unaffected, or it may be partly transparent or translucent partially allowing the transmission of light but without allowing objects to be seen clearly through the window area.

A window area may be formed in a polymeric security document which has at least one layer of transparent polymeric material and one or more opacifying layers applied to at least one side of a transparent polymeric substrate, by omitting least one opacifying layer in the region forming the window area. If opacifying layers are applied to both sides of a transparent substrate a fully transparent window may be formed by omitting the opacifying layers on both sides of the transparent substrate in the window area.

A partly transparent or translucent area, hereinafter referred to as a "half-window", may be formed in a polymeric security document which has opacifying layers on both sides by omitting the opacifying layers on one side only of the security document in the window area so that the "half-window" is not fully transparent, but allows some light to pass through without allowing objects to be viewed clearly through the half-window.

Alternatively, it is possible for the substrates to be formed from an substantially opaque material, such as paper or fibrous material, with an insert of transparent plastics material inserted into a cut-out, or recess in the paper or fibrous substrate to form a transparent window or a translucent half-window area.

Opacifying Layers

One or more opacifying layers may be applied to a transparent substrate to increase the opacity of the security document. An opacifying layer is such that $L_T<L_0$ where $L_0$ is the amount of light incident on the document, and $L_T$ is the amount of light transmitted through the document. An opacifying layer may comprise any one or more of a variety of opacifying coatings. For example, the opacifying coatings may comprise a pigment, such as titanium dioxide, dispersed within a binder or carrier of heat-activated cross-linkable polymeric material. Alternatively, a substrate of transparent plastic material could be sandwiched between opacifying layers of paper or other partially or substantially opaque material to which indicia may be subsequently printed or otherwise applied.

In one disclosed embodiment, the gauge thickness of the lens array may be optimised with respect to the size of the image elements and the set of lens parameters.

In another disclosed embodiment, the lens parameters may be optimised with respect to the size of the image elements and the gauge thickness.

By choosing lens parameters such that the focal point size is correlated with the size of the image elements, the thickness of the lens array, or the lens frequency, can be reduced without substantially sacrificing image quality. This is because the majority of rays refracted through the lenslets and reaching the object plane will still intersect with the region covered by an image element at the desired viewing angle or angles and this allows the sampling effect to be maintained.

The thickness of the lens array can be reduced to provide a thinner lenticular sheet which still results in high quality image effects. Alternatively, the thickness can be maintained whilst widening the lenslets to allow more printing to be included under each lenslet, thus improving image quality and/or allowing for more complex visual effects to be produced.

Optionally, the thickness of the lens array is less than the focal length of all of the lenslets.

In one disclosed embodiment, the predetermined amount by which the focal point size varies from the size of the image elements is not more than 20% of the size of the image elements. If the focal point size is larger than the size of the image elements, this allows for an even thinner lenticular sheet whilst substantially maintaining the desired image quality, since in general, only a relatively small portion of the power density distribution of the refracted rays will lie at the edges of the spot. If the focal point size is slightly smaller, the transitions between the image components producing the image effects can be made smoother.

The image elements may take the form of dots, lines or other shapes. The image elements may be applied to a surface in the object plane on the opposite side of the transparent or translucent material in a variety of ways, including laser marking. In one disclosed embodiment, the image elements are printed on the surface in the object plane. The method of the disclosed embodiments may include the step of applying a plurality of printed dots to a rear surface of the transparent or translucent material with the lenslets formed on a front surface to form an optically variable device or article. Alternatively, a plurality of printed dots may be applied to a substrate (for example, of fibrous or polymeric material), and the substrate attached to the rear surface of the transparent or translucent material.

The lenslets may formed by an embossing process in a transparent or translucent radiation-curable material applied to a substrate. The transparent or translucent radiation-curable material may be cured following embossing, but is optionally embossed and cured substantially simultaneously. The substrate may be formed from a transparent or translucent polymeric material with the combined thickness of the substrate and radiation curable material corresponding to the gauge thickness of the lens array. In one disclosed embodiment, the substrate is a flexible, sheet-like structure, and the substrate and radiation curable material form part of a security document, such as a banknote, credit card or the like. The substrate may be substantially the same refractive index as the lenslets.

In one disclosed embodiment, the set of lens parameters is the same for each lenslet.

In another disclosed embodiment, the focal point size, when averaged over at least two directions within the lobe angle of the lenslet, is substantially equal to the size of the image elements, or varies from the size of the image elements by a predetermined amount.

The directions over which the focal point size are averaged may include the on-axis direction, and an off-axis direction near the edge of the lobe angle.

Another disclosed embodiment provides a method of designing a lens array for imaging a plurality of image elements in an object plane, the lens array including a plurality of lenslets and having a gauge thickness corresponding to the distance from the apex of each lenslet to the object plane, the method including the steps of:

estimating a scale parameter which is representative of the size of the image elements in the object plane, selecting a set of lens parameters for each lenslet, and designing the lens array using the scale parameter to optimize the gauge thickness and/or at least one lens parameter of the set of lens parameters for each lenslet, wherein each lenslet has a focal point size in the object plane which is substantially equal to the size of the image elements, or which varies from the size of the image elements by a predetermined amount.

Optionally, the thickness of a lens array including the lenslets is less than the focal length of all of the lenslets.

The set of lens parameters may be the same for each lenslet. Alternatively, the lenslets in an area or areas of the lens array may have different lens parameters to the lenslets in the remainder of the lens array.

Optionally, the method further includes the step of measuring the sizes of the image elements in at least part of the object plane, wherein the scale parameter is estimated from the measured sizes of the image elements. The measurement may be performed using a densitometer, or alternatively may be performed by directly measuring the sizes of the image elements. Optionally, the image elements are part of a calibration template. In one disclosed embodiment, the image elements are printed lines or dots.

Measuring the sizes of the printed lines or dots allows the lens design to be tailored to the actual characteristics of the print, which may depend on the type of printing apparatus, inks and other materials, and prepress equipment used.

The scale parameter may be estimated by computing the mean or maximum of the sizes of the image elements. Alternatively, it may be estimated using a robust estimator, optionally an M-estimator, or one of the median, upper quartile or interquartile mean of the sizes of the image elements.

A further disclosed embodiment provides a method of manufacturing an optically variable device, including the steps of:

providing a substrate;

applying image elements to the substrate, the image elements being located in an object plane;

determining a scale parameter which is representative of the size of the image elements; and forming a plurality of lenslets in a transparent or translucent material on the substrate;

wherein each lenslet has a set of lens parameters determined so that the lenslets have a focal point size in the object plane which is substantially equal to the size of the image elements, or which varies from the size of the image elements by a predetermined amount.

In one disclosed embodiment, the scale parameter is determined by measuring the sizes of the image elements.

Optionally, the substrate is formed from a transparent or translucent sheet-like material with the lenslets formed in or on a first surface on one side of the substrate and the image elements applied to a second surface on the opposite side of the substrate. The lenslets may be formed in the transparent or translucent sheet-like material itself. Alternatively, the lenslets may be formed in a transparent or translucent layer, e.g. by embossing a radiation-curable transparent or translucent resin, applied to a substrate which may be transparent, translucent or opaque.

The image elements may be formed by any convenient process, including printing or laser marking. In one disclosed method, the image elements are printed dots.

Another disclosed embodiment provides an optically variable device, including a substrate and a plurality of lenslets formed in or on the substrate, and a plurality of image elements located in an object plane in or on the substrate, wherein each lenslet has a set of lens parameters determined so that the lenslets have a focal point size in the object plane which is substantially equal to the size of the image elements, or which varies from the size of the image elements by a predetermined amount.

Optionally, the lenslets are part of a lens array having a gauge thickness which is less than the focal length of each of the lenslets.

A further disclosed embodiment provides an optically variable device including a lens array according to one disclosed embodiment.

An optically variable device manufactured by the methods above may be applied to a wide range of articles, though the disclosed embodiments have particular application to the field of security documents, and more particularly to security documents and articles formed from a flexible sheet-like substrate, such as banknotes or the like. The optically variable device may be formed in a window or half-window area of the security document.

BRIEF DESCRIPTION OF THE DRAWINGS

Disclosed embodiments will now be described, by way of non-limiting example only, with reference to the accompanying figures, in which:

FIGS. 4 to 6 depict the on- and off-axis focal point sizes of three lenslets according to different embodiments;

DETAILED DESCRIPTION OF DISCLOSED EMBODIMENTS

Figure 1:
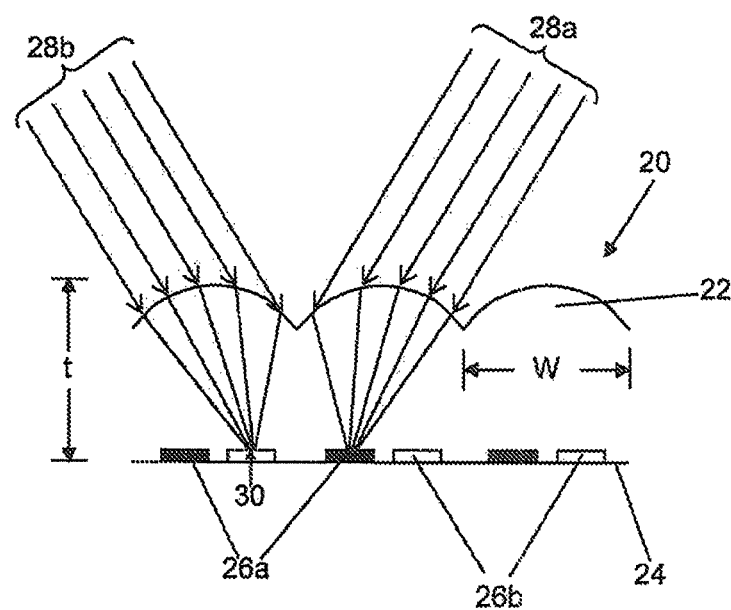
FIG. 1 shows a cross section through a lens array of prior art design.

Referring initially to FIG. 1, there is shown a lens array 20 of prior art design, having a gauge thickness t, in which lenslets 22 having a width W and substantially spherical profile focus incident rays 28a and 28b onto the black dots 26a and the white dots 26b respectively. The dots have been printed on lower surface 24. The thickness t is substantially equal to the focal length of the lenslets, and so the focal point size 30 is at a minimum.

The focal point size 30 of the prior art lenslet is smaller than the resolution of the printing at the lower surface 24. For example, traditional lenticular offset lithographic methods print an average halftone dot size of approximately 25 microns. A properly designed lenticular lens of 254 microns in width will collimate light to a focal point size of approximately five microns on axis, which is substantially smaller than the size of the printed dots 26a, 26b.

Figure 2:
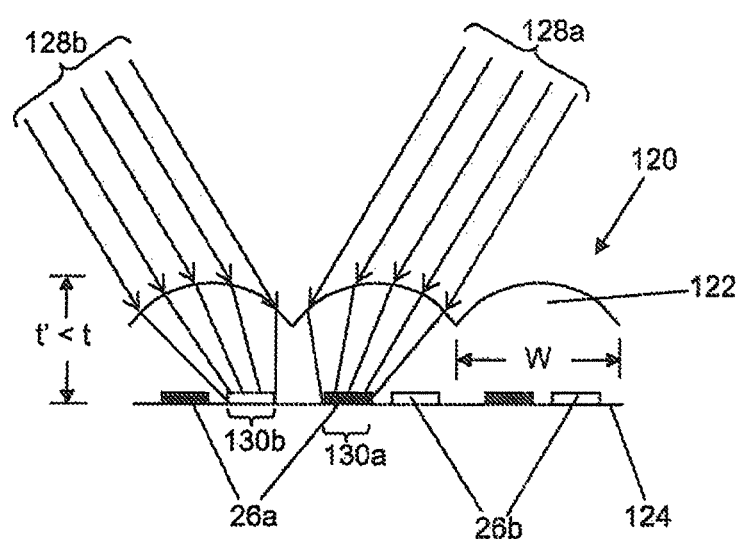
FIG. 2 shows one embodiment of the lens array.

Referring now to FIG. 2, there is shown a lens array 120 according to one disclosed embodiment. Incident rays 128a, 128b are refracted towards dots 26a, 26b respectively. The lens array 120 has a thickness t' which is less than t, and the lenslets 122 have a width W. The lenslets 122 are designed in such a way that the focal point sizes 130a, 130b are substantially equal in extent to dots 26a, 26b. We have found that as long as the focal point size does not exceed the average width of a printed halftone dot by more than 20%, the quality of the image is not compromised. We have also found that simply producing an arbitrary non-focussing design severely degrades the image quality, resulting in an objectionably blurred image. The focal point size may also be slightly smaller than the average width, optionally no more than 20% smaller.

Figure 3:
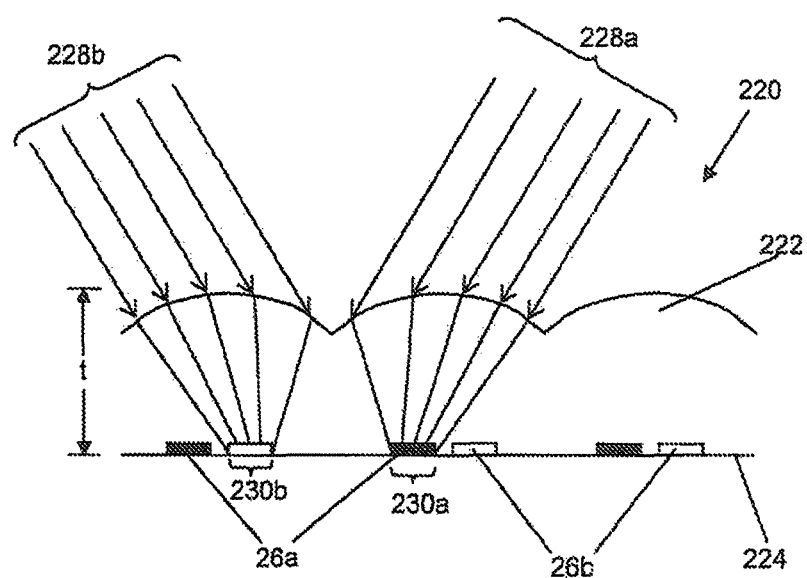
FIG. 3 shows a second embodiment of the lens array.

FIG. 3 depicts an alternative lens array design, in which lens array 220 is at the same thickness t as prior art lens array 20, but the width W of the lenslets 222 has been increased. At the same time, other lens parameters have been varied so that incident rays 228a, 228b are refracted and arrive at the object plane 224 to intersect with dots 26a, 26b so that the focal point sizes 230a, 230b are again substantially equal in extent to the dots 26a, 26b. For example, the lens radius of curvature can be made larger, as shown in FIG. 3, possibly simultaneously varying other lens parameters such as refractive index, conic parameter or Abbe number in order to achieve the optimum image quality.

FIG. 4 illustrates a cross sectional side view of a ray trace of a wide angle lenslet 105 designed according to one embodiment. Rays 102 refracted at surface 101 reach the object plane 104 and result in focal point sizes 103A, 103B. In this embodiment, the focal point sizes of on-axis points 103A and off-axis points 103B have been weighted equally across the entire viewing angle of the lenslet, this angle also being known as the lobe angle.

Figure 6:
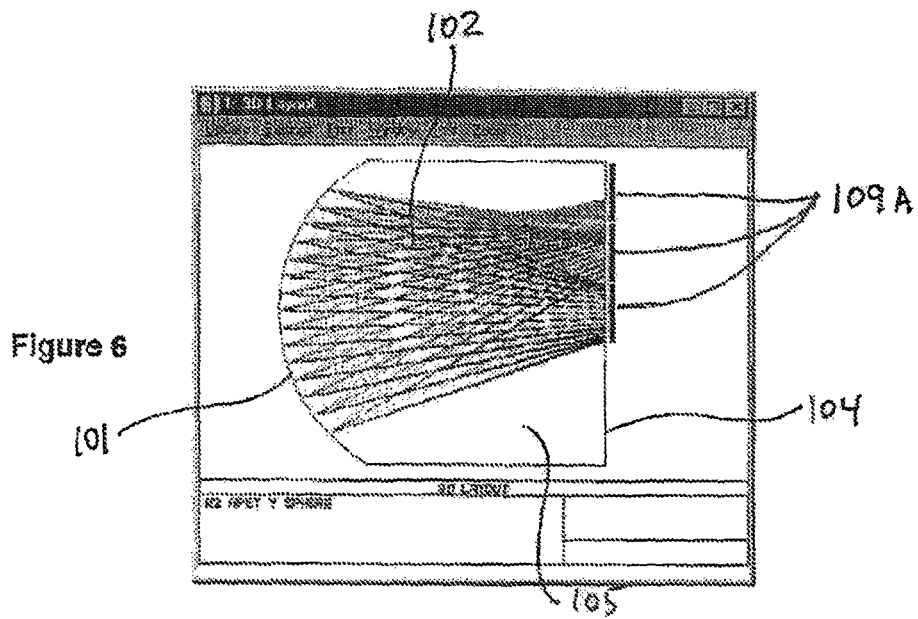

FIG. 5 shows a cross sectional side view of a ray trace of an alternative wide angle lenslet 101 where the focal point width is substantially equal to the average width of printed halftone dots 109A, across the lobe angle. In FIG. 6 there is shown a cross sectional side view of a ray trace of a further wide angle lenslet where the printed halftone dots 109A are larger still, allowing for a further reduction in material thickness, or a coarser lens frequency, or both.

Figure 7:
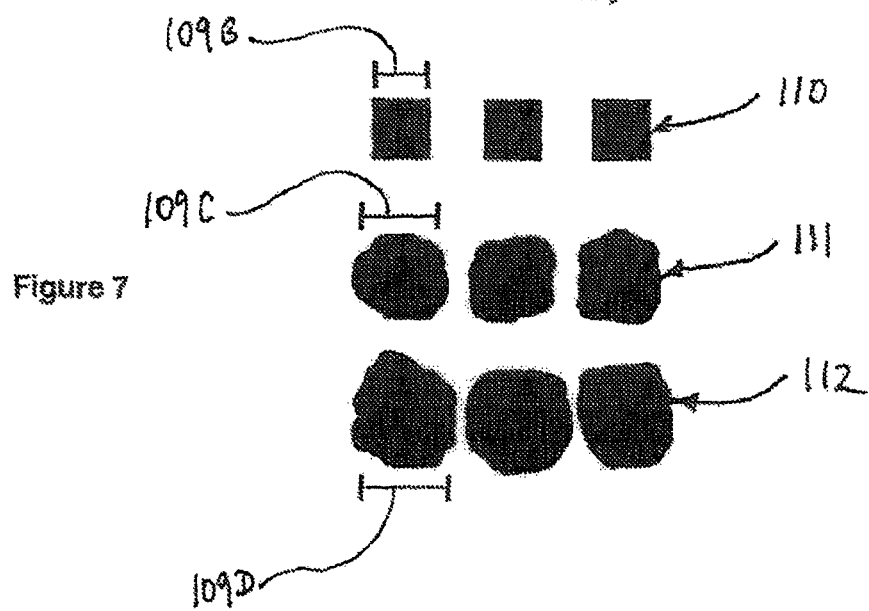
FIG. 7 shows the input and output dot shapes of two different printing processes.

In FIG. 7 the top row of dots 110 represents digital pixels of a known width 109B on a print calibration form that are output to a printing plate. Row 111 illustrates the printed result of printing row 110, where noticeable dot gain results in an average dot width 109C. Row 112 illustrates the printed result of printing row 110 using another print method, where the dot gain is even greater than row 111, resulting in average dot width 109D. In this illustration, a different lens design may apply for the printed dots in row 111 than the printed dots in row 112, where the optimised lens design for row 111 may resemble FIG. 5, and the optimized lens design of row 112 may more closely resemble FIG. 6.

Figure 8:
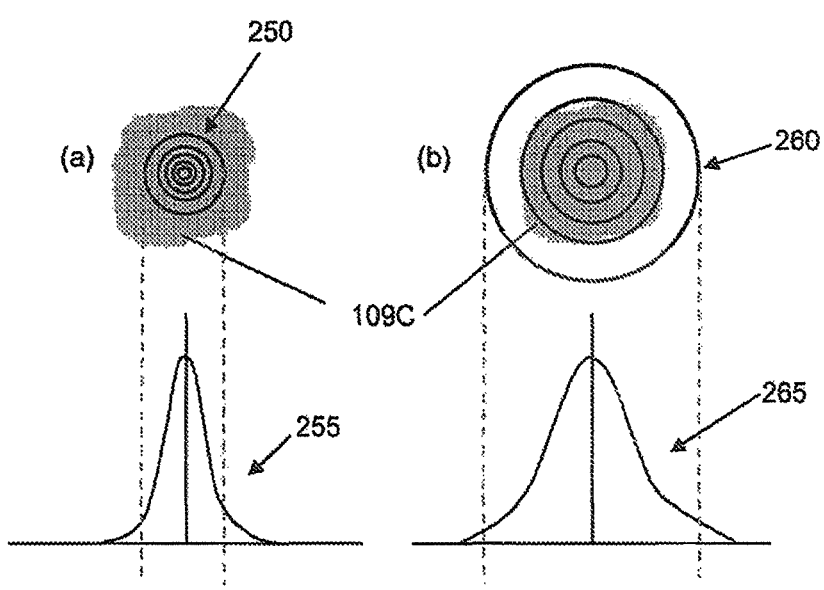
FIG. 8 shows the power density distributions of a prior art lenslet and a lenslet according to one embodiment, respectively.
Figure 9:
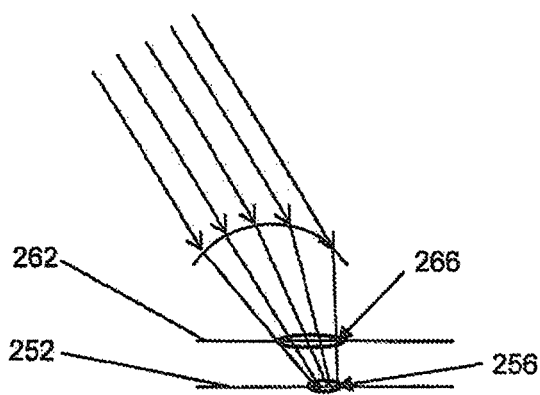
FIG. 9 shows incident light rays being refracted through a lenslet according to one embodiment.

Referring now to FIG. 8, there is shown a projection view of a printed halftone dot 109C imaged by a lenslet according to one embodiment. FIG. 8(a) shows contours 250 of the power density distribution 255 which would result if the object plane was located at the focal plane 252 of the array to produce spot 256 (FIG. 9). Instead, the spot 266 in object plane 262 is larger than the dot 109C, but has a power density distribution 260, 265 such that the majority of the incident radiation is still reaching dot 109C in order to preserve the sampling effect.

In order to print a continuous tone image to paper or synthetic materials such as plastics, it is necessary to convert it to a halftone image. A number of methods for doing so are known in the art. Such methods represent continuous tone through the use of binary dots of either varying sizes, so called amplitude modulation (AM) methods, or dots of the same size with varying frequency, so called frequency modulation (FM) methods. Various combinations of the two methods, called hybrids, are also used. For the present purposes, any of these methods may be employed. However, the FM method, in its variety of forms including but not limited to dithering, error diffusion, or random or stochastic screening, is the preferred method because the dots remain generally constant in size.

Measurement of the characteristics of the printed halftone dots can be accomplished using a variety of known methods. For example, the average dot size can be determined by printing a press calibration template consisting of swatches of dots of a given size and having various densities, where each swatch typically represents a density value from one percent to ninety nine percent. The template is subsequently imaged to film or plate, and printed onto the smooth side of an optical effect substrate. The printed result is then scanned using a densitometer, or similar tool, to determine the printed dot size.

Alternatively, the average dot size can be measured directly, for example using a microscope fitted with a reticle displaying increments of measurement. In the direct method, a sample of dots can be measured in each tonal value range, recorded, and their sizes averaged.

We have found that measurement of dots at a tonal value of about 20% provides the best results.

In some instances it may not be possible or feasible to obtain the above measurements, because of varying press conditions or the like. If this is the case then an average expected dot size can be estimated, from previous experience or otherwise.

With reference to FIG. 10, we now describe one method of optimising the design of a lenslet for use in one disclosed embodiment. For the purposes of this non-limiting example, we take lenslet 300 to be an aspheric lens which is rotationally symmetric. This method relies on relatively simple theoretical calculations using geometrical optics, and ignoring edge effects at the periphery of the lens. The skilled person will appreciate that many other methods are possible, including the use of more sophisticated physical models, ray tracing simulations and so on.

Figure 10A:
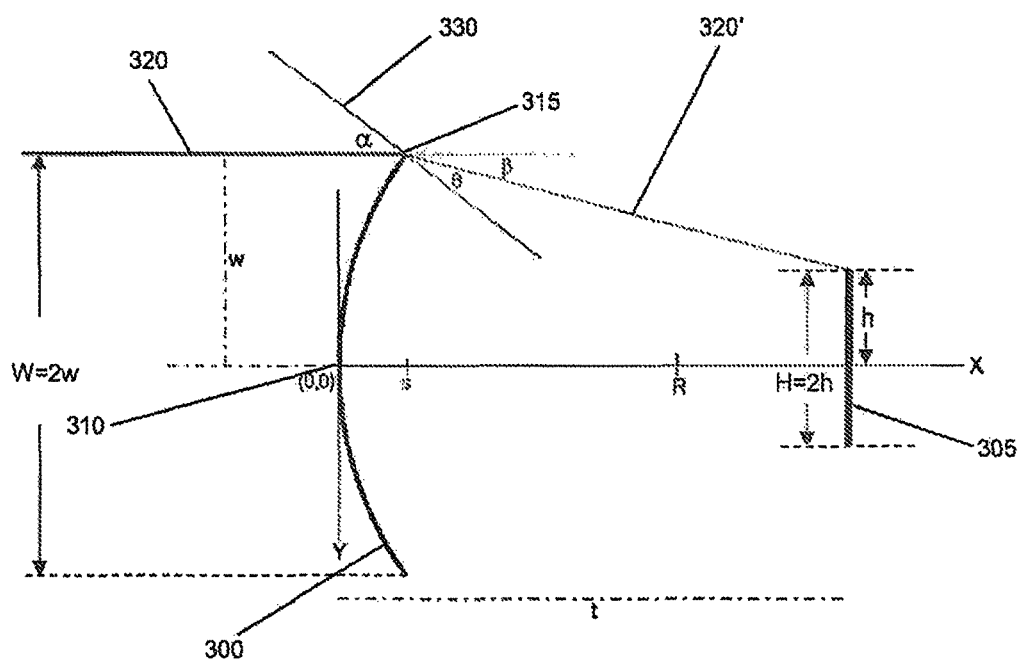
FIG. 10 depicts the geometry of a lenslet.
Figure 10B:
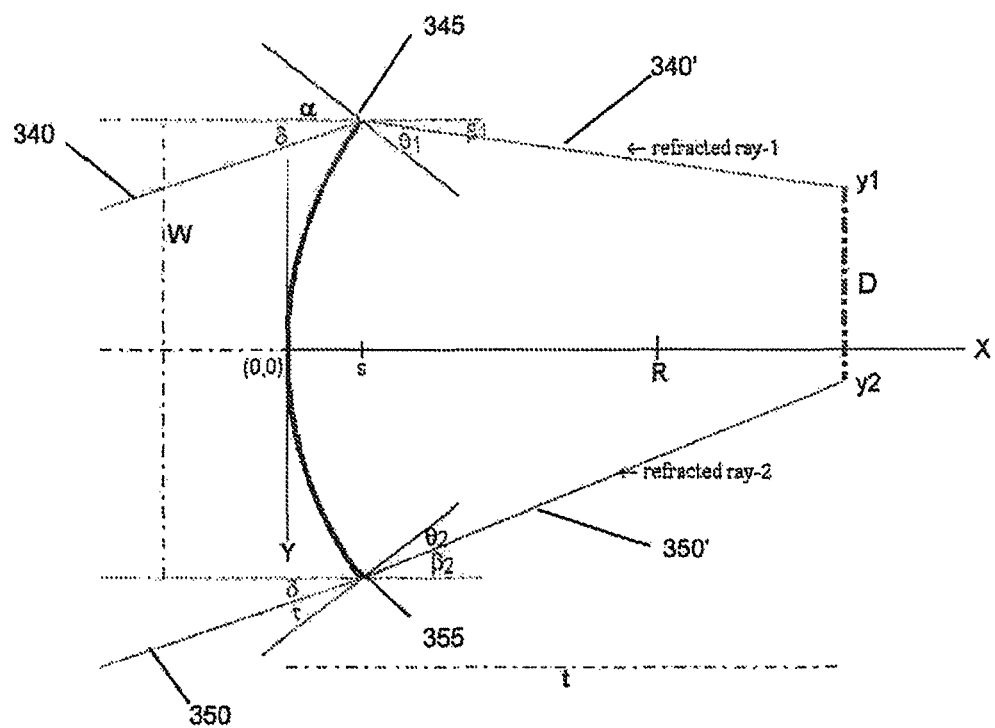

In FIG. 10(a), an image element in the form of a printed dot 305 of full width H and half-width h is located in an object plane an unknown distance t (the gauge thickness) from the origin of the (x,y) coordinate system, which corresponds with the vertex 310 of the lens 300. Lens 300 has a sag height s and a half-width w, and refractive index n (not shown in Figure). An optimal lens design will result in incident ray 320 which is incident parallel to the x axis, arriving at the edge 315 of lens 300 and refracted at an angle β intersecting the top of the dot 305. We thus wish to find an expression for t in terms of the lens parameters and the half-width h which is a scale parameter representative of the size of the dot 305.

The equation of the lens profile function y(x) is given by $$P*x^2 - 2*R*x + y(x)^2 = 0,$$

where R is the lens radius at the edge 305 of the lens, and P is the conic constant and is equal to $1-e^2$, where e is the eccentricity. In principle, a more general lens profile function y(x) including higher powers of x could be chosen. However, it is generally more convenient for lens design purposes to use the quadratic form of y(x) as above.

The normal 330 to the surface of the lens at edge 305 (x=s, y=w) has a slope $$m(x) = \frac{-1}{y'(x)}$$

where y'(x) is the first derivative of y(x). This slope is equal to Tan(α) where □ is the angle between incident ray 320 and the normal 330, and so $$\text{Tan}(\alpha) = m(x)$$

so that $$\alpha(x) = \text{ArcTan}\left(\frac{\sqrt{2*R*x - P*x^2}}{P*x - R}\right).$$

By Snell's law, $$n_1 * \text{Sin}(\alpha) = n * \text{Sin}(\theta)$$

where θ is the angle between refracted ray 320' and the normal 330, and $n_1$ is the refractive index of air (taken to be 1 as an approximation hereafter). Hence $$\theta = \text{ArcSin}\left(\frac{\text{Sin}(\alpha)}{n}\right).$$

The slope A of the line joining (s,w) and (t,h) is $$A = -\text{Tan}(\beta)$$

and substituting for β=α−θ, $$A = -\text{Tan}\left[\alpha(s) - \text{ArcSin}\left(\frac{\text{Sin}(\alpha(s))}{n}\right)\right]. \quad (1)$$

It is relatively straightforward to show that t can be written as $$t = s + \frac{h - w}{A} \quad (2)$$

with A as in Eq (1) above and $$\alpha(s) = \text{ArcTan}\left(\frac{w}{\sqrt{R^2 - P*w^2}}\right). \quad (3)$$

The thickness t can be optimised with respect to one or more of the lens parameters R, n, P, w and s in the usual way, i.e. by taking the partial derivatives of the expression in Eq (2) with respect to one or more of those parameters and setting the partial derivatives equal to zero. The resulting system of equations can be solved analytically or numerically in order to find the set of lens parameters which gives the optimal lens thickness.

The optimisation may be a constrained optimisation. For example, there may be practical manufacturing limitations on the range of t and it thus may be desirable to limit t to that range of values. Constrained optimisation methods are known in the art.

The above formulae have been derived for incident rays parallel to the x axis. The derivation can be generalised for off-axis rays 340, 350 and off-axis dots (FIG. 10(b)) whereby one obtains $$D = \|(M-m)*(t-s) + 2*w\|,$$

where D is the off-axis dot size, M is the slope of the refracted ray 340' at one edge 345 of the lenslet, and m is the slope of the refracted ray 350' at the opposite edge 355 of the lenslet, with t being the desired gauge thickness, s the sag height and w the lens half-width as before.

When the angle of deviation, δ, of the incident rays is zero, M=−m=A, and the equation reduces to $$D = 2M*(t-s) + 2w.$$

In this case, D becomes equal to 2h, the full dot size, and $$t = s + \frac{h - w}{A},$$

which corresponds to the expression for on-axis rays derived earlier.

Alternatively to the above, it is possible to optimise the lens half-width w as a function of some or all of R, n, P and s, while t may be held fixed. This can be done by rewriting Eq (2) in terms of w as follows:

$$w = h - A*(t-s).$$

If t is held fixed, a constrained optimisation may be performed to find the optimal lens half-width w.

As a further alternative, other lens parameters R, n, P or s may be optimised in a similar manner to the above.

The above model does not explicitly include a treatment of chromatic aberration. The skilled person will appreciate that the conic constant P and/or the Abbe number of the lens may be chosen to minimise chromatic aberration.

Figure 11:
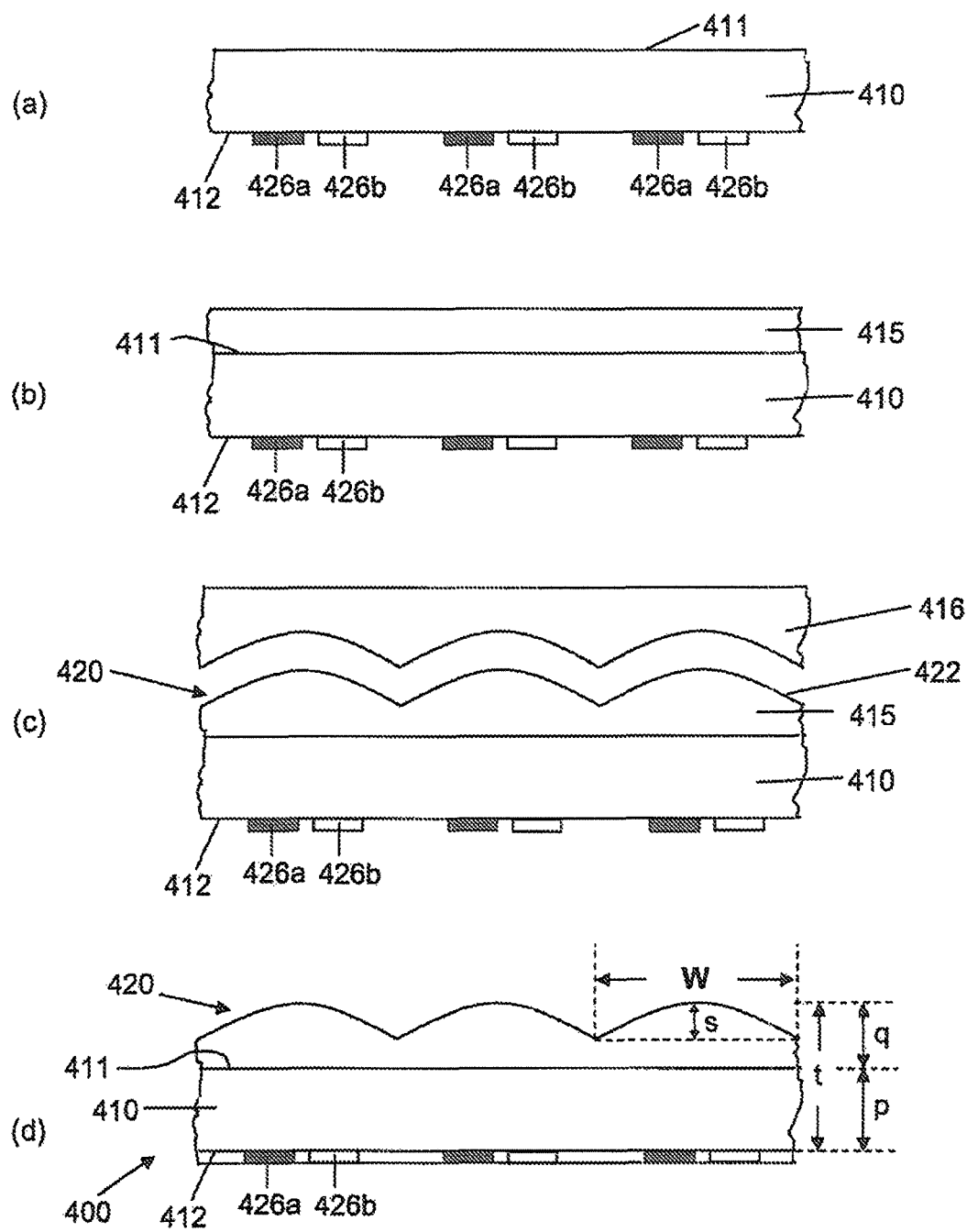
FIGS. 11(a) to 11(d) illustrate a schematic cross-sectional view through an article incorporating a lens array and image elements and the intermediate steps by which the article is formed.

In FIG. 11(d) there is shown an article 400 formed from a substrate 410 of transparent or translucent material having a lens array 420 formed on a front surface 411 on one side of the substrate 410 and image elements 426a, 426b formed on a rear surface 412 on the opposite side of the substrate 410. In one disclosed method of manufacturing the article 400, the image elements 426a, 426b are first applied to the rear surface 412 of the substrate 410 on the opposite side (FIG. 11(a)). The image elements 426a, 426b may be applied by printing on the rear surface 412, though they may be formed in or on the rear surface by other methods, including laser marking.

FIG. 11(b) shows a transparent or translucent embossable layer 415 applied to the front surface 411 of the transparent or translucent substrate 401. Optionally, the embossable layer is a radiation curable liquid, resin or ink, which may be applied by a printing process. The layer 415 is then embossed with an embossing shim 416 (FIG. 11(c)) to form a plurality of lenslets 422 of the lens array 420 in the layer 415 in register with the image elements 426a, 426b on the rear surface 412 of the substrate 410. The embossed layer 415 may be cured by radiation, e.g. by UV, X-rays, electron beams or heat (IR), either simultaneously during the embossing process or subsequently, to fix the embossed structure of the lenslets 422 in the lens array 420.

Figure 12:
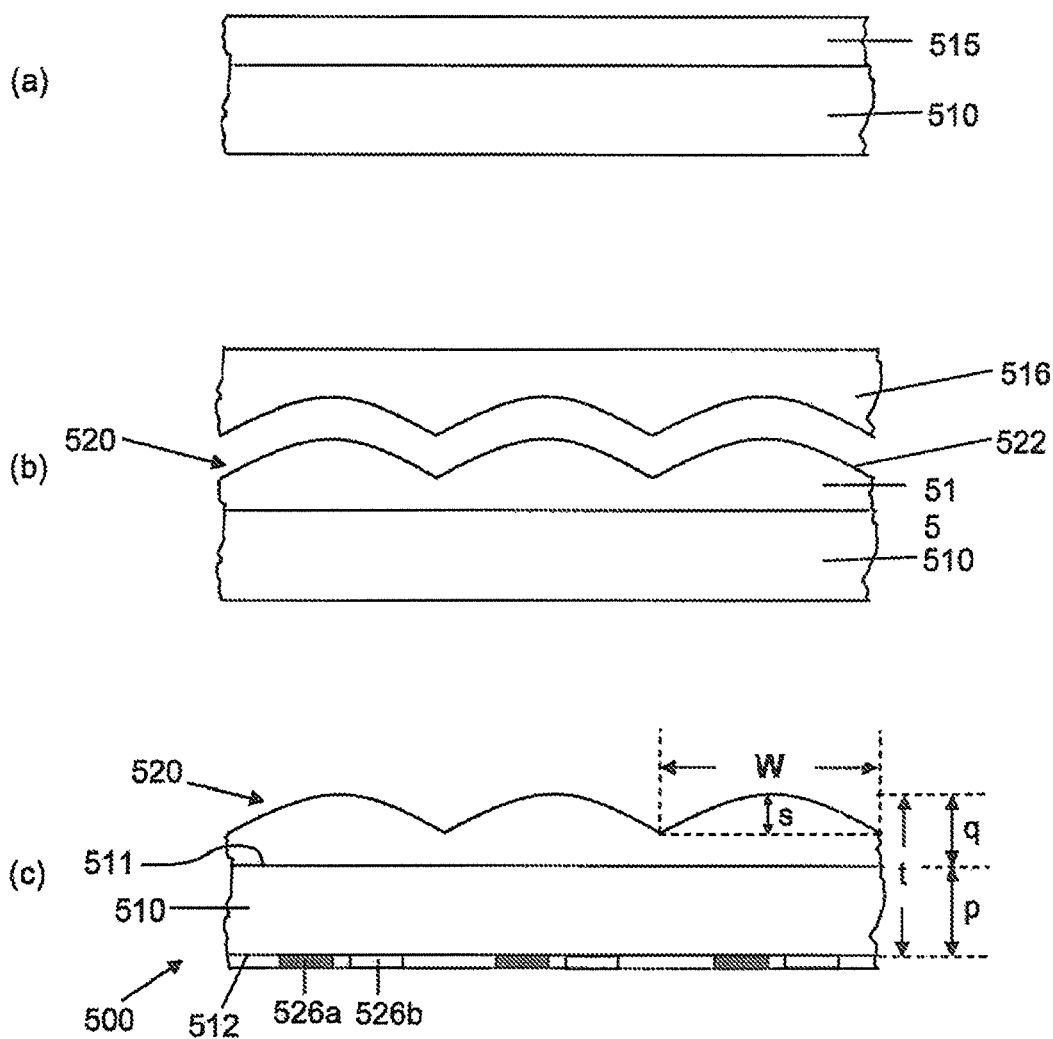
FIGS. 12(a) to 12(c) show a schematic cross-sectional view through an article similar to that of FIG. 11(d), made by a modified method.
Figure 13:
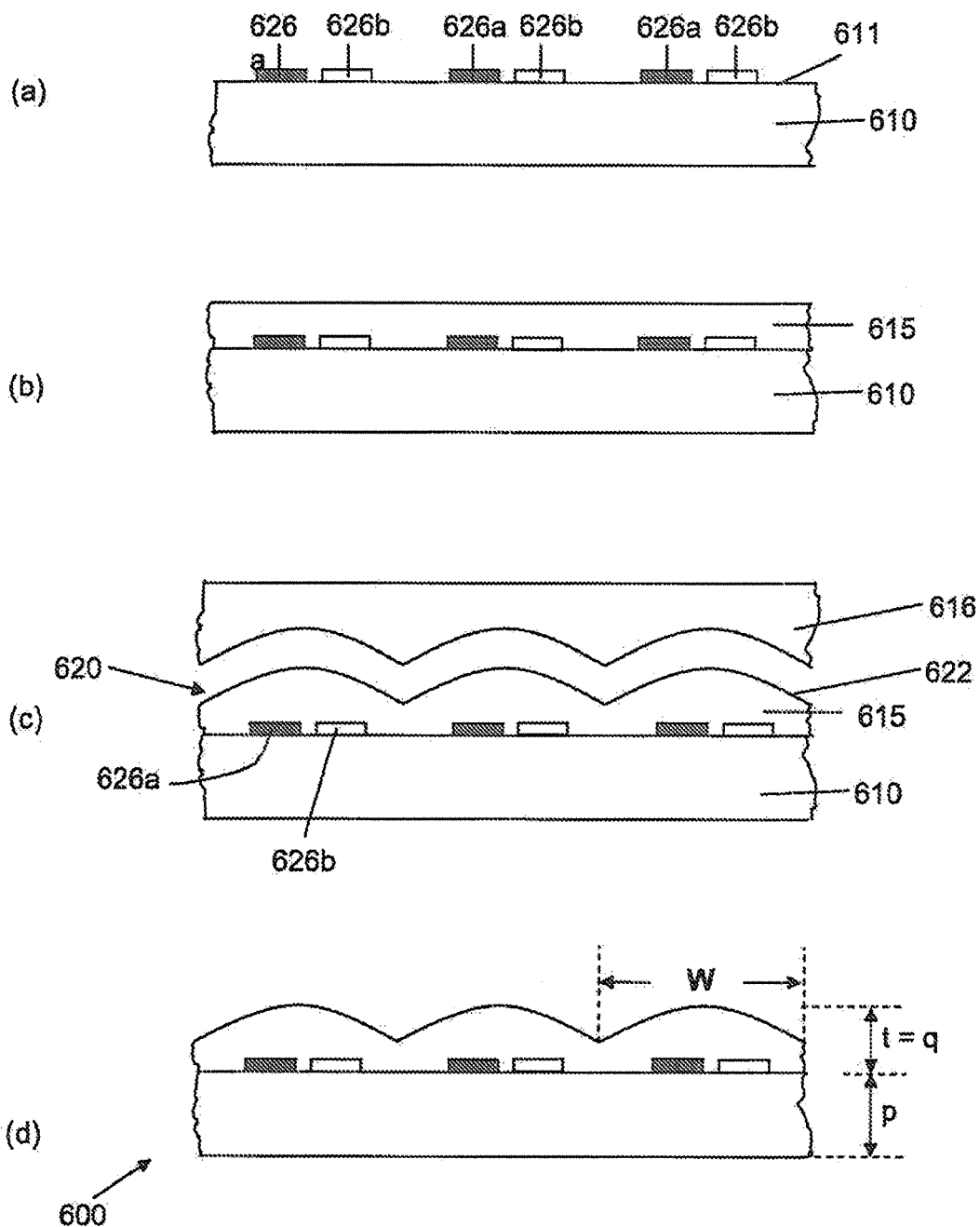
FIGS. 13(a) to 13(d) illustrate a schematic cross-sectional view through an alternative article incorporating a lens array and image elements, and the intermediate steps by which the article is formed.

Referring to FIG. 12 there is shown an alternative method for producing an article 500 similar to that of FIG. 11(d) in that it is formed from a substrate 510 of transparent or translucent material having a lens array 520 formed in an embossable layer 515 applied to a front surface 511 of the substrate and image elements 526a, 526b formed in or on the rear surface 512 of the substrate.

In the method shown in FIG. 12, the embossable layer 515 is first applied to the front surface 511 on one side of the substrate 510 (FIG. 12(a)) and then embossed by embossing shim 516 (FIG. 12(b)) before the image elements 526a, 526b are applied to the rear surface 512 on the opposite side of the substrate 510. Again, the embossable layer 515 may be formed from a radiation curable liquid, resin or ink which may be applied by a printing process, and may be cured by radiation either substantially simultaneously during the embossing process or thereafter. The image elements 526a, 526b may be formed by printing or laser marking on the rear surface 512 of the substrate 510 to form the resulting article 500 of FIG. 12(c).

In the resulting articles 400, 500 of FIG. 11(d) and FIG. 12(c), it will be appreciated that the lens arrays 420, 520 have a gauge thickness t=p+q, where p is the thickness of the transparent or translucent substrate 410, 510 and q is the thickness of the transparent or translucent layer 415, 515 measured from the front surface 411, 511 of the substrate 410, 510 to the apex of each lenslet 422, 522 after embossing.

Figure 14:
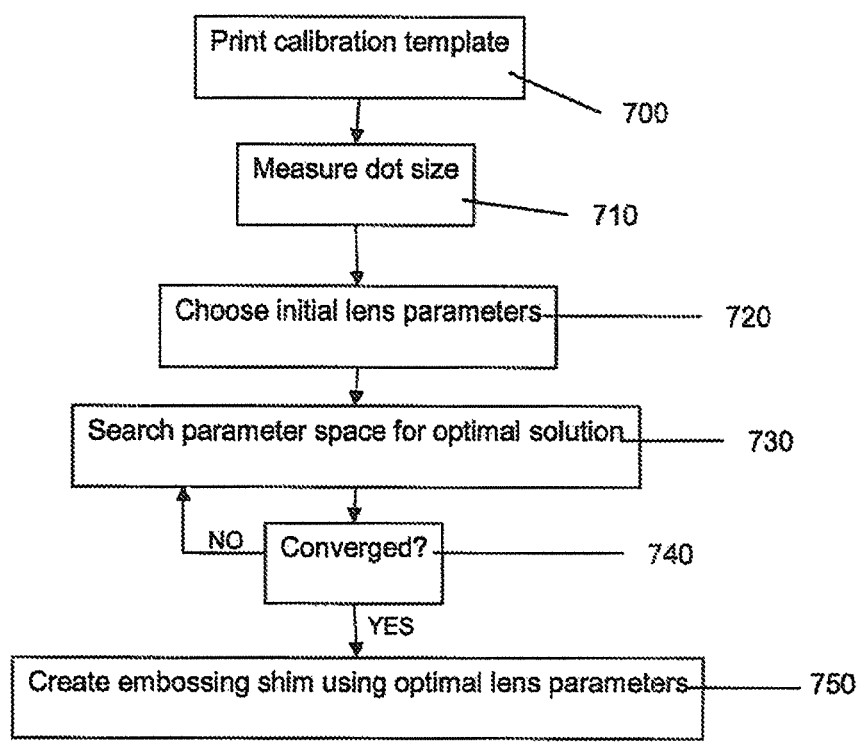
FIGS. 14 and 15 are block diagrams showing two different embodiments of a lens array manufacturing process for producing the articles of FIGS. 11 to 13.

In many cases, the thicknesses p and q of the substrate 410 and layer 415 will be predetermined, the average dot size H=2h will be determined by the printing method or other process used to form the image elements, and one or more lens parameters, e.g. lens width W=2w, radius of curvature R, sag s, refractive index n or conic constant P may be optimised in relation to t (=p+q) to create an embossing shim for forming the lens array 420, 520 in accordance with the process of FIG. 14 described later.

Referring to FIGS. 13(a) to 13(d) there is shown a method for producing an article 600 which has a lens array 620 formed in a transparent or translucent layer 615 applied over image elements 626a, 626b on a front surface 611 of one side of a substrate 610. The substrate 610 in FIG. 13 may be transparent, translucent or opaque since the lens array 620 and the image elements 626a, 626b are formed on the same side of the substrate 610. In the method shown in FIG. 13, the image elements 626a, 626b are first applied to the front surface 611 on the substrate, optionally by printing (FIG. 13(a)), before the transparent or translucent layer 615 is applied (FIG. 13(b)) and embossed by embossing shim 616. Once again, the embossable layer 615 may be formed from a radiation curable liquid, resin or ink, which may be applied by a printing process, and is cured by radiation either simultaneously or subsequently to fix the lens structure of the lenslets 622 of the lens array 620.

The resulting article 600 of FIG. 13(d) differs from that of FIGS. 11(d) and 12(c) in that the thickness p of the substrate 610 has no effect on the gauge thickness t of the lens array 620 which is substantially equal to the thickness q of the transparent or translucent layer 615 (allowing for the thickness of the image elements 626a, 626b). As the gauge thickness t of the lens array 620 of article 600 is likely to be less than the gauge thickness t of the lens arrays 420, 520 of articles 400, 500 of FIGS. 11(a) and 12(a), the method of one disclosed embodiment may be used to compensate for the reduced gauge thickness by reducing the lens width W, or radius of curvature R, or adjusting other parameters of the lenslets 622 of the lens array 620, by appropriate variation of the shape of the embossing shim 616.

Referring now to FIG. 14, there is shown a flow chart for a process for creating an embossing shim for use with certain disclosed embodiments. Firstly, a calibration template is printed (step 700), and the dot size measured (step 710) as described above. Then an initial set of lens parameters is chosen (step 720) and the parameters varied in a multivariate optimisation process (steps 730, 740). Once a solution is found, an embossing shim can be created (step 750) for use in the fabrication process.

Figure 15:
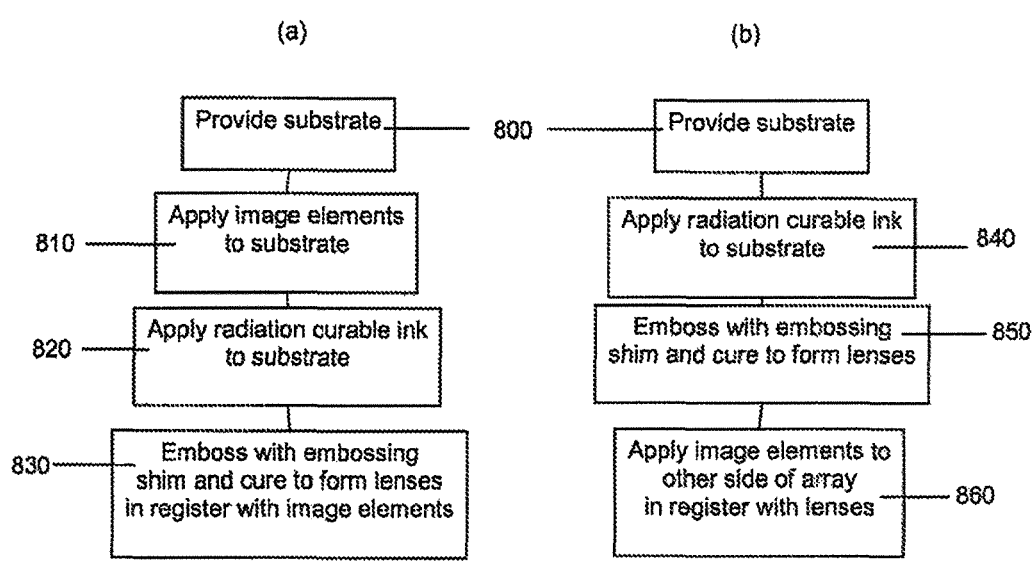

In FIGS. 15(a) and 15(b), flow charts of two alternative methods for forming an optical effect article are shown. In both cases a substrate is provided (step 800). The process shown in FIG. 15(a) is suitable for forming the articles 400 and 600 of FIGS. 11 and 13. In the embodiment of FIG. 15(a), two or more interleaved images are applied to a front or rear surface of the substrate (step 810), optionally by printing. A radiation curable ink may then be applied to the front surface of the substrate (step 820), for example by a printing process, and the ink is then embossed with an embossing shim obtained from step 750 of FIG. 14. The ink is then cured to form the lenslets of the optical effect article in the embossed surface. The curing step may occur substantially simultaneously with the embossing step (step 830). In FIG. 15(b), the radiation curable ink is instead applied to one side of the substrate first (step 840). The ink is then embossed with an embossing shim obtained from step 750 of FIG. 14 and cured to form the lenslets (step 850). The image elements are then applied to the side of the substrate opposite the lenslets, in register with the lenslets, in order to form the optical effect article.

Example

Figure 16:
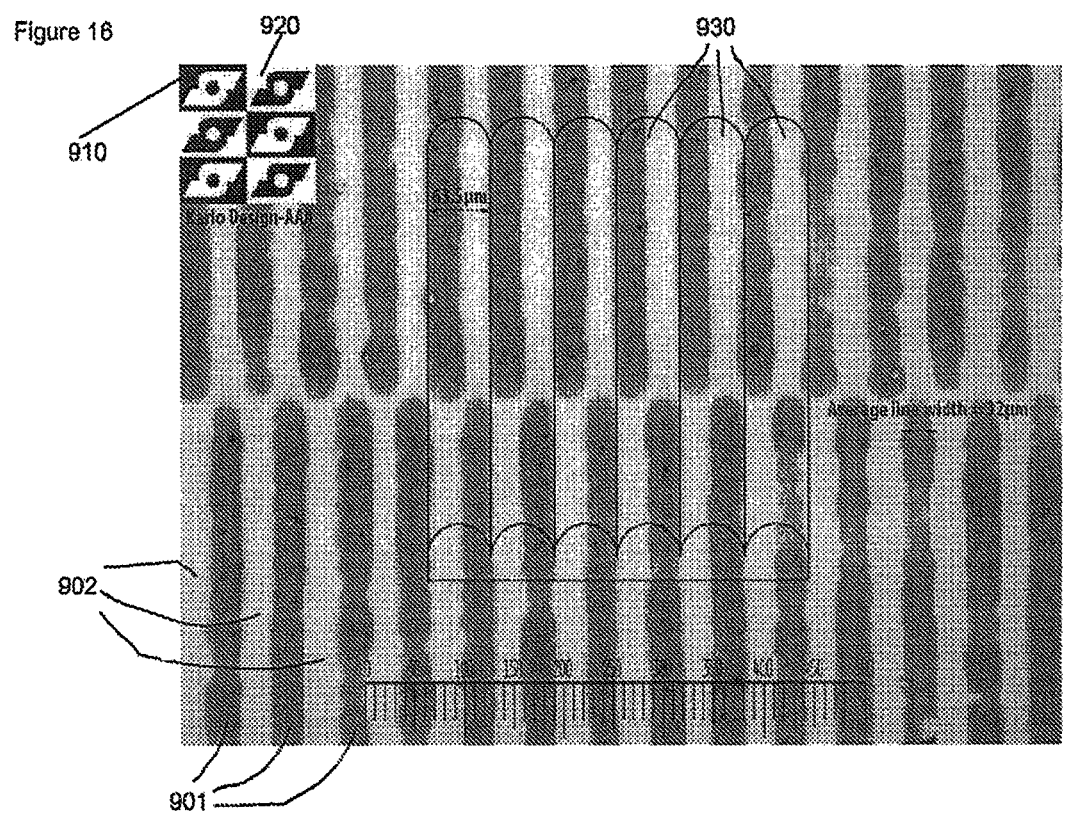
FIG. 16 is a set of interleaved printed image elements of an example lenticular device.

Referring to FIG. 16, there is shown an example of a printed interleaved image 900 which is used to produce a binary "flipping image" effect when paired with a suitable lens array. In the example shown, the image elements are black stripes 901 interleaved with white stripes 902. When viewed through a lenticular lens array having lenticules 920, a device having a combination of lenticular array and image elements 901, 902 produces a switch from the image 910 shown at upper left in FIG. 16 to image 920, in which black and white areas are reversed, as the device is tilted with respect to the viewer about an axis parallel to the direction of the stripes.

The black and white stripes 901, 902 were applied to a substrate by gravure printing. Upon measurement using the reticle of a microscope, the black stripes were found to have an average width of 32 microns, while the white stripes had an average width of 31.5 microns. The average value of 32 microns for the black stripes was taken to be the scale parameter representative of the size of the image elements. The width W of the lenticules 930 (shown overlaid in outline on the printed image elements 901, 902) was fixed at 63.5 microns, and the gauge thickness t optimised using the expression in Equation (2). This resulted in an optimum gauge thickness t of 90 microns at a sag height s of 10 microns and a radius of curvature R of 55.4 microns, compared to a gauge thickness of approximately 162 microns if the image elements were located at the nominal focal length of the lenticules.

Figure 17:
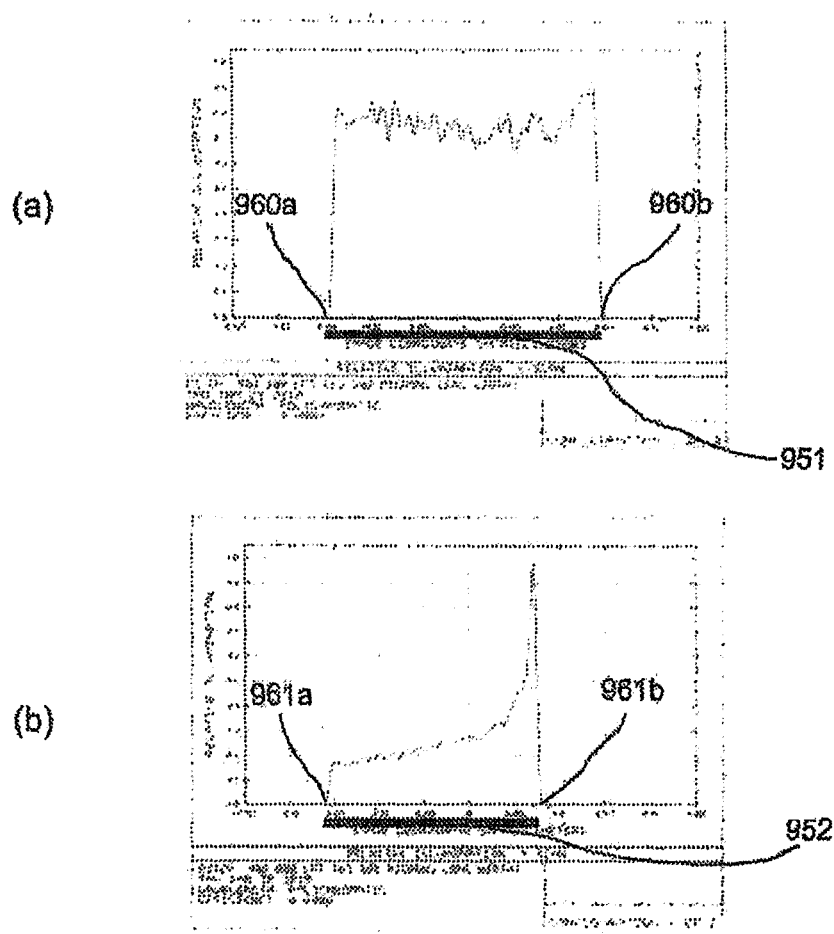
FIG. 17 illustrates the (simulated) relative illumination of points along the width of the image elements of the device of FIG. 16, when viewed (a) on-axis and (b) off-axis.

In order to check that the focal point sizes of lenticules having the above design were sufficiently close to the image element size to produce the desired flipping image effect, the above parameters were input to a ray tracing simulation in optical system design software produced by Zemax Development Corporation and sold under the trade mark ZEMAX. The relative illumination plots shown in FIGS. 17(a) and 17(b) can be used to determine the focal point size, this being the distance between the pairs of points (960a, 960b) and (961a, 961b) respectively where the relative illumination drops to zero. It can be seen that the on-axis focal spot size 951 is approximately 30 microns while the off-axis focal spot size 952 is approximately 23 microns. An "average" image element viewed on axis will thus be within 6%-7% of the focal spot size.

It will be appreciated that various modifications may be made to the disclosed embodiments described above without departing from the spirit or scope of the invention. For example, it is possible that lenslet structures of a lens array could be directly embossed into a surface of a transparent or translucent substrate, instead of into a transparent or translucent embossable layer applied to a substrate. Also, whilst printing one disclosed process for forming image elements, the image elements may be formed by laser marking. In this case, it is possible for a laser to be directed through a transparent or translucent substrate or layer from a laser source on one side of the substrate or layer to mark a laser sensitive surface on the opposite side of the substrate or layer to form the image elements after the lens array has been formed.

The invention claimed is:

1. A lens array for imaging a plurality of image elements in an object plane, the lens array comprising:
   a plurality of lenslets formed in or on one side of a transparent or translucent material with the image elements disposed on the opposite side,
   wherein the lens array has a gauge thickness corresponding to a distance from an apex of each lenslet, of the plurality of lenslets, to the object plane,
   wherein each lenslet has a set of lens parameters,
   wherein at least one of the gauge thickness at least one lens parameter of the set of lens parameters is optimised such that either:
      each lenslet of the plurality of lenslets has an effective focal width in the object plane which is substantially equal to the size of the image elements in the object plane, or
      each lenslet of the plurality of lenslets has an effective focal width in the object plane which] varies from the size of the image elements by a predetermined amount.

2. A lens array according to claim 1, wherein the set of lens parameters for the lenslets include two or more of the following: lens width, refractive index, sag height, radius of curvature, conic parameter and Abbe number.

3. A lens array according to claim 1, wherein the predetermined amount by which the effective focal width varies from the size of the image elements is not more than 20% of the size of the image elements.

4. A lens array according to claim 1, wherein the set of lens parameters is the same for each of the lenslets.

5. A lens array according to claim 1, wherein the lenslets in one area or areas of the lens array have different lens parameters from the lenslets in another area or other areas of the lens array.

6. A lens array according to claim 1, wherein the effective focal width, when averaged over two or more directions within the lobe angle of the lenslet, is substantially equal to the size of the image elements, or varies from the size of the image elements by a predetermined amount.

7. A method of manufacturing a lens array for imaging a plurality of image elements in an object plane, the lens array including a plurality of lenslets, the lens array having a gauge thickness corresponding to a distance from an apex of each lenslet to the object plane, the method comprising:
   determining a scale parameter which is representative of the size of the image elements in at least part of the object plane,
   using the scale parameter to optimize at least one of the gauge thickness and at least one parameter of a set of lens parameters for each lenslet, and
   forming the lens array with the gauge thickness and the lens parameters in, or on one side of, a transparent or translucent material with the image elements being disposed on an opposite side of the transparent or translucent material, whereby;
      each lenslet of the plurality of lenslets has an effective focal width in the object plane which is substantially equal to the size of the image elements, or
      each lenslet of the plurality of lenslets has an effective focal width in the object plane which varies from the size of the image elements by a predetermined amount.

8. A method according to claim 7, wherein the gauge thickness of the lens array is optimised with respect to the size of the image elements and the set of lens parameters.

9. A method according to claim 7, wherein the lens parameters are optimised with respect to the size of the image elements and the gauge thickness.

10. A method according to claim 7, wherein the predetermined amount by which the effective focal width varies is less than an estimated variability in the size of the image elements, and the estimated variability is the standard deviation, median absolute deviation or interquartile range of the size of the image elements.

11. A method according to claim 7, wherein the image elements are applied to a surface on the opposite side of the transparent or translucent material by printing, or by laser marking.

12. A method according to claim 7, wherein the lenslets are formed by an embossing process in a transparent or translucent radiation-curable material applied to a substrate formed from a transparent or translucent material, and the combined thickness of the substrate and radiation-curable material corresponds to the gauge thickness of the lens array.

13. A method of designing a lens array for imaging a plurality of image elements in an object plane the lens array including a plurality of lenslets and having a gauge thickness corresponding to a distance from an apex of each lenslet to the object plane, the method comprising:
   estimating a scale parameter which is representative of a size of each of the image elements of the image elements in the object plane,
   selecting a set of lens parameters for each lenslet of the plurality of lenslets, and
   designing the lens array using the scale parameter to optimize at least one of the gauge thickness and at least one lens parameter of the set of lens parameters for each lenslet of the plurality of lenslets, wherein:
      each lenslet of the plurality of lenslets has an effective focal width in the object plane which is substantially equal to the size of the image elements, or
      each lenslet of the plurality of lenslets has an effective focal width in the object plane which varies from the size of the image elements by a predetermined amount.

14. A method according to claim 13, wherein the set of lens parameters includes two or more of the following: lens width, refractive index, sag height, lens width, radius of curvature, conic parameter and Abbe number.

15. A method according to claim 13, further including measuring the sizes of the image elements in at least part of the object plane, wherein the scale parameter is estimated from the measured sizes of the image elements.

16. A method of manufacturing an optically variable device, the method comprising:
provide a substrate;
applying image elements to the substrate, the image elements being located in an object plane;
determining a scale parameter which is representative of the size of the image elements; and
forming a plurality of lenslets in a transparent or translucent material on the substrate,
wherein each lenslet of the plurality of lenslets has a set of lens parameters determined so that:
each of the lenslets of the plurality of lenslets has an effective focal width in the object plane which is substantially equal to the size of the image elements, or
each of the lenslets of the plurality of lenslets has an effective focal width in the object plane which varies from the size of the image elements by a predetermined amount.

17. A method according to claim 16, wherein the scale parameter is determined by measuring the sizes of the image elements.

18. An optically variable device, comprising:
a substrate; and
a plurality of lenslets formed in, or on, the substrate; and
a plurality of image elements located in an object plane in or on the substrate,
wherein each lenslet of the plurality of lenslets has a set of lens parameters determined so that:
each of the lenslets of the plurality of lenslets has an effective focal width in the object plane which is substantially equal to the size of the image elements; or
each of the lenslets of the plurality of lenslets has an effective focal width in the object plane which varies from the size of the image elements by a predetermined amount.

19. A device according to claim 18, wherein the lenslets are part of a lens array having a gauge thickness which is less than the focal length of each of the lenslets.

20. A security document including an optically variable device according to claim 19, wherein the optically variable device is formed in a window or half-window area of the security document.

* * * * *